(12) United States Patent
Gopinath et al.

(10) Patent No.: US 9,472,272 B2
(45) Date of Patent: Oct. 18, 2016

(54) RESISTIVE SWITCHING MEMORY WITH CELL ACCESS BY ANALOG SIGNAL CONTROLLED TRANSMISSION GATE

(71) Applicant: Adesto Technologies Corporation, Sunnyvale, CA (US)

(72) Inventors: Venkatesh P. Gopinath, Fremont, CA (US); Deepak Kamalanathan, Santa Clara, CA (US); Daniel Wang, San Jose, CA (US)

(73) Assignee: Adesto Technologies Corporation, Santa Clara, CA (US)

(*) Notice: Subject to any disclaimer, the term of this patent is extended or adjusted under 35 U.S.C. 154(b) by 0 days.

(21) Appl. No.: 14/628,280

(22) Filed: Feb. 22, 2015

(65) Prior Publication Data

US 2016/0247564 A1    Aug. 25, 2016

(51) Int. Cl.
*G11C 13/00*    (2006.01)

(52) U.S. Cl.
CPC ......... *G11C 13/0011* (2013.01); *G11C 13/003* (2013.01)

(58) Field of Classification Search
CPC ..................... G11C 13/0011; G11C 13/008
USPC ........................................................ 365/148
See application file for complete search history.

(56) References Cited

U.S. PATENT DOCUMENTS

| 5,459,686 | A | 10/1995 | Saito |
| 8,653,497 | B2 | 2/2014 | Tran |
| 2010/0296213 | A1 | 11/2010 | Lee et al. |
| 2012/0026778 | A1 | 2/2012 | Maejima |
| 2012/0069627 | A1 | 3/2012 | Minemura et al. |
| 2013/0028010 | A1* | 1/2013 | Li ........................ G11C 11/16 365/158 |
| 2013/0119340 | A1 | 5/2013 | Hou et al. |
| 2014/0104927 | A1 | 4/2014 | Sutardja et al. |
| 2014/0254238 | A1* | 9/2014 | Gilbert ................ G11C 13/004 365/148 |
| 2014/0340958 | A1* | 11/2014 | Gharia ................ G11C 11/161 365/158 |

* cited by examiner

*Primary Examiner* — Hoai V Ho
*Assistant Examiner* — Tri Hoang
(74) *Attorney, Agent, or Firm* — Michael C. Stephens, Jr.

(57) ABSTRACT

In one embodiment, a semiconductor memory device includes a plurality of resistive switching memory cells, where each resistive switching memory cell can include: (i) a programmable impedance element having an anode and a cathode; (ii) a word line pair configured to control access to the programmable impedance element, where the word line pair comprises first and second word lines; (iii) a PMOS transistor having a source coupled to the cathode, a drain coupled to a bit line, and a gate coupled to the first word line; and (iv) an NMOS transistor having a source coupled to the bit line, a drain coupled to the cathode, and a gate coupled to the second word line.

16 Claims, 12 Drawing Sheets

RESISTIVE SWITCHING MEMORY WITH CELL ACCESS BY ANALOG SIGNAL CONTROLLED TRANSMISSION GATE

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive switching memory technologies that include resistive RAM (ReRAM) and conductive bridging RAM (CBRAM), may offer relatively lower power and higher speeds as compared to flash memory technologies. For example, CBRAM utilizes a conductive bridging cell technology, which has the potential to scale to smaller sizes than flash memory devices.

SUMMARY

Embodiments of the present invention relate to a resistive switching memory device. Particular embodiments are suitable for resistive switching memories, such as resistive random-access memory (ReRAM) and/or conductive bridging RAM (CBRAM) memory cells.

In one embodiment, a semiconductor memory device includes a plurality of resistive switching memory cells, where each resistive switching memory cell can include: (i) a programmable impedance element having an anode and a cathode; (ii) a word line pair configured to control access to the programmable impedance element, where the word line pair comprises first and second word lines; (iii) a PMOS transistor having a source coupled to the cathode, a drain coupled to a bit line, and a gate coupled to the first word line; and (iv) an NMOS transistor having a source coupled to the bit line, a drain coupled to the cathode, and a gate coupled to the second word line.

In one embodiment, a semiconductor memory device includes a plurality of resistive switching memory cells, where each resistive switching memory cell can include: (i) a programmable impedance element having an anode and a cathode; (ii) a word line pair configured to control access to the programmable impedance element, wherein the word line pair comprises first and second word lines; (iii) a PMOS transistor having a source coupled to a bit line, a drain coupled to the anode, and a gate coupled to the first word line; and (iv) an NMOS transistor having a drain coupled to the bit line, a source coupled to the anode, and a gate coupled to the second word line.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Example CBRAM Cell Structure and Arrangement

Particular embodiments may be directed to resistive switching memories (e.g., conductive bridging random-access memory [CBRAM], resistive RAM [ReRAM], etc.). The invention, in its various aspects, will be explained in greater detail below with regard to exemplary embodiments. Particular embodiments can include structures and methods of operating resistive switching memories that can be programmed/written and erased between one or more resistance and/or capacitive states. Resistive switching memory devices can include a plurality of resistive memory cells with "programmable impedance elements" or any type of resistive switching or resistance-change memory cells or elements.

Figure 1:
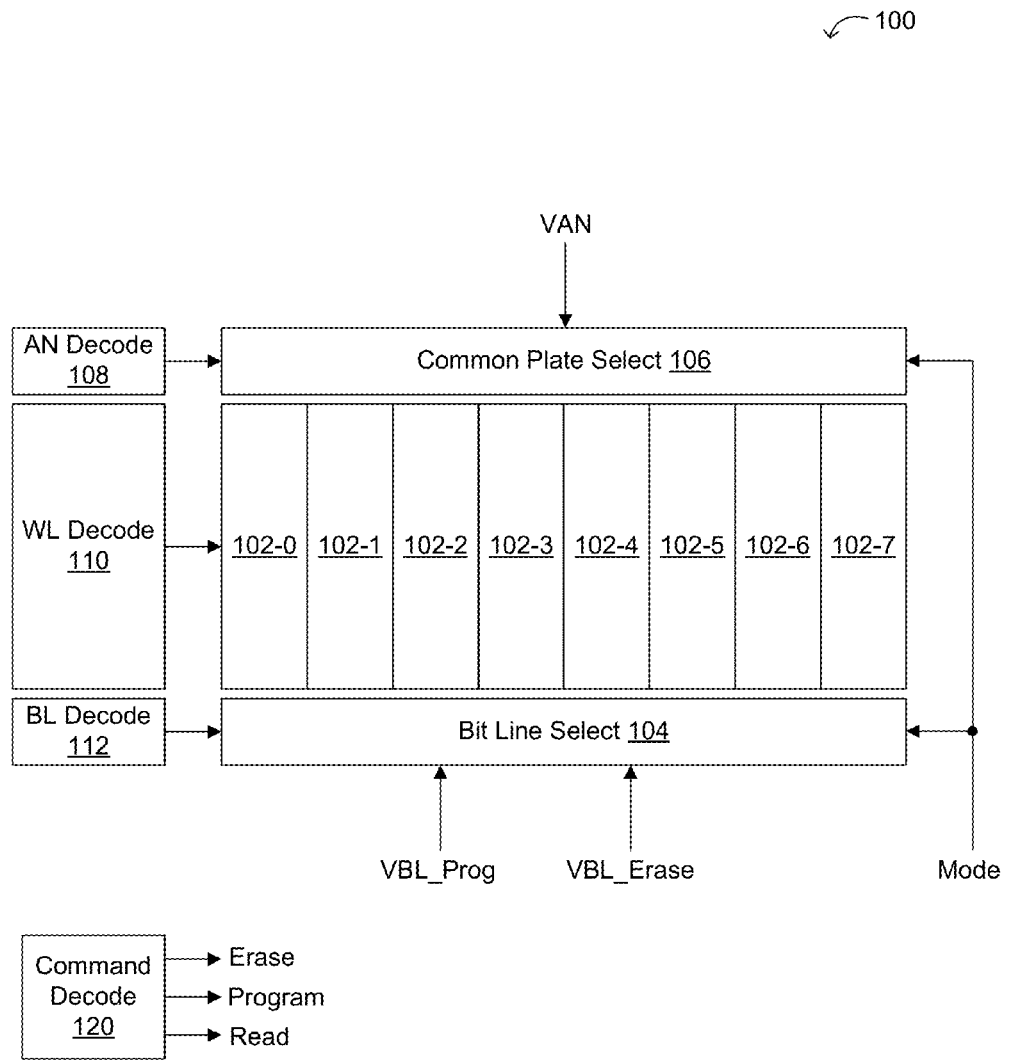
FIG. 1 is an example memory device arrangement.
Figure 2:
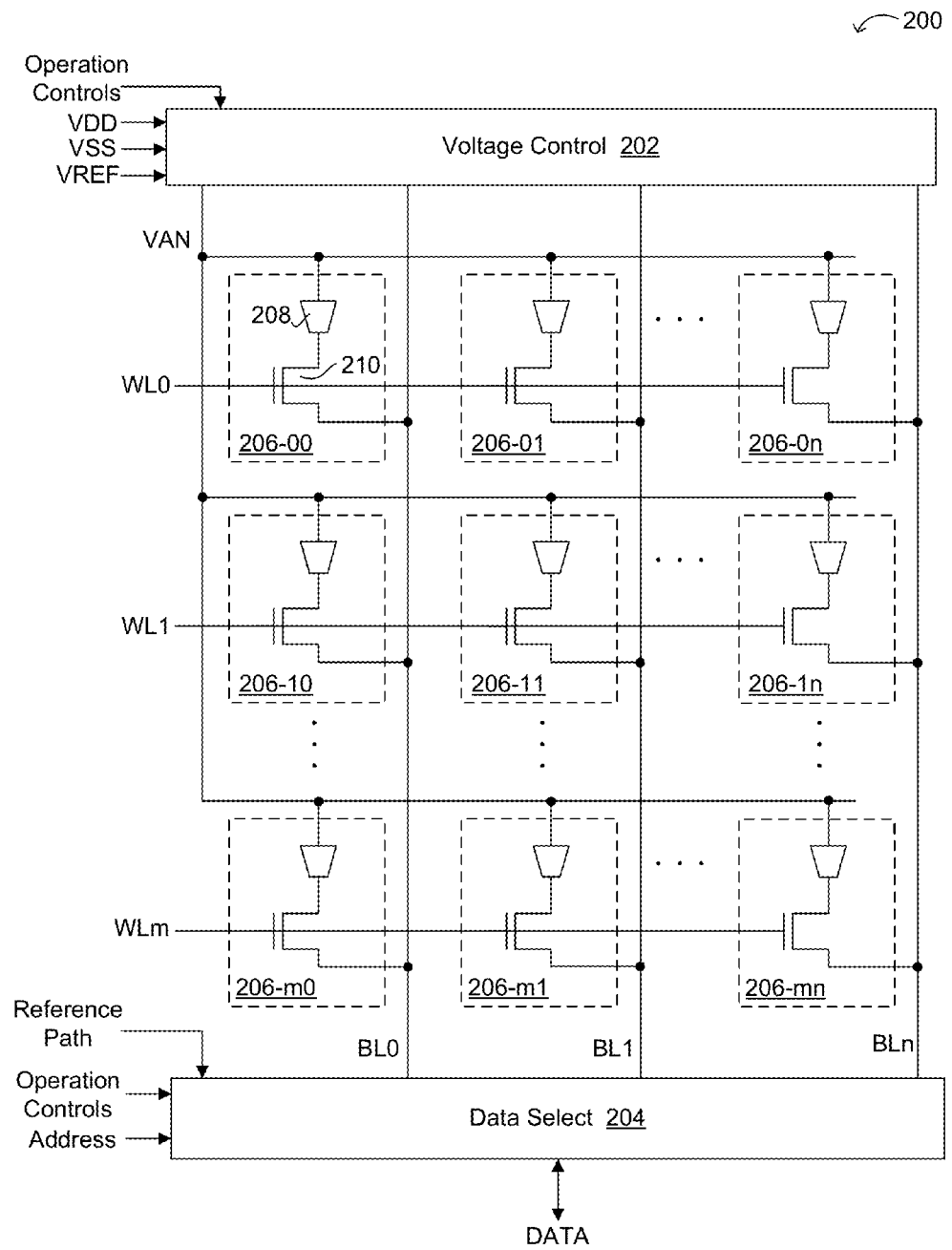
FIG. 2 is a schematic block diagram of an example common anode array structure.

FIGS. 1 and 2 show example memory architectures and circuit structures that can utilize programmable impedance elements. However, particular embodiments are amenable to a wide variety of memory architectures, circuit structures, and types of resistive switching memories.

Referring now to FIG. 1, an example memory device is shown and designated by the general reference character 100. A memory device 100 can include common anode sectors 102-0 to 102-7, bit line selection circuitry 104, common plate selection circuitry 106, anode decoding circuitry 108, word line decoding circuitry 110, and bit line decoding circuitry 112. A memory device 100 can be a single integrated circuit, or may form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

Common anode sectors (102-0 to 102-7) can each include a number of memory cells arranged into one or more columns and multiple rows, and coupled to a common anode plate. Each memory cell can include one or more programmable impedance elements or CBRAM storage elements, and a selection device. Generally, a CBRAM storage element may be configured such that when a bias greater than a threshold voltage is applied across electrodes of the CBRAM storage element, the electrical properties of the CBRAM storage element can change. For example, in some arrangements, as a voltage is applied across the electrodes of the CBRAM storage element, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

Voltages VBL_Prog, VBL_Erase, and VAN may be conventional power supply voltages, such as +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a CBRAM cell by applying suitable voltages across the electrodes thereof.

Bit line selection circuitry 104 can selectively connect bit lines of one or more common anode sections (102-0 to 102-7) according to a mode of operation and bit line decoding values. In one particular example, bit line selection circuitry 104 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Common plate selection circuitry 106, can connect anode plates to an inhibit voltage for CBRAM cells that are not selected (e.g., via anode decode 108) for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected CBRAM device can be switched between program and erase operations. In this way, program and erase can be "symmetric" operations. That is, in a programming operation, a CBRAM cell to be programmed can be connected between suitable voltages (e.g., V1-V2) in an anode-to-cathode direction. In an erase operation, a CBRAM cell to be erased can be connected between suitable voltages (e.g., V2-V1) in a cathode-to-anode direction.

Bit line decoding circuitry 112 can generate values for selecting given bit lines for read, program, and erase operations. In one arrangement, in response to address information (e.g., column address data), bit line decoding circuitry 112 can generate bit line select signals for application to bit line select circuitry 104. Word line decoding circuitry 110 can generate values for selecting a given set of memory cells by enabling access devices in one or more selected rows of common anode sections (102-0 to 102-7). In response to address information (e.g., row address data), one or more word lines can be driven to a select voltage to thereby enable the corresponding select device (e.g., a transistor) in a row of memory cells.

Referring now to FIG. 2, shown is a schematic block diagram of an example common anode array structure 200, which can be one implementation of the example shown in FIG. 1. In this example, voltage control 202 can receive various supply voltages (e.g., VDD, VSS, VREF, etc.), as well as operation controls (e.g., program, erase, verify, read, etc.). Resistive memory cells 206 can include a programmable impedance element 208 and an access transistor 210, as shown. In this particular arrangement, the anode of each memory cell 206 can connect together in a common anode structure. For example, the common anode (AN) can be a large plate structure that may be biased at a voltage VAN generated by voltage control 202. Of course, other voltage generation control and regulated levels, as discussed above, can be utilized in certain embodiments.

Thus as shown in this particular example, common anode plates (VAN) can be shared by multiple CBRAM cells. Along these lines, each memory array or array block may have multiple such anode plates (VANs). In addition, word lines and bit lines can be arranged in an orthogonal fashion for accessing individual CBRAM or other such resistive memory cells. Of course, any number of anode plates, anode plate voltages (VANs), memory array or array block sizes, and/or memory array arrangements, etc., can be supported in particular embodiments.

In this example, data select 204 can provide an interface between the bit lines (BL0, BL1, . . . BLn) and a data path that is coupled to a sensing or amplification block, as well as to write circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed and decoded. In addition, word line (WL0, WL1, . . . WLm) decoding can be utilized for activation of the appropriate word line for a given cycle.

Further, a reference path can also be coupled to data select 204. The reference path can be used by a sensing circuit in order to compare against a regular bit line. For example, a current from a selected bit line and its selected memory cell 206 can be compared against a current from a reference bit line, where the reference bit line is biased such that appropriate data states on the selected memory cell via the selected bit line can be detected. In one application, the capacitance on the reference bit line and reference memory cell structure can match the capacitance on a regular memory cell/bit line such that these effects are negated during the sensing process.

Other architectures can also be employed with sensing circuitry, arrangements, and methods of particular embodiments. For example, a common cathode structure, whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is a strapped source structure. In any event, particular embodiments are suitable to a wide variety of resistive memory cell architectures and arrangements.

Data select 204 can also receive operation control signals. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. For example, a common bidirectional sensing circuit can be employed in each of these operations. In particular, the bidirectional sensing circuit can allow for a program verify to be performed using a same forward bias (anode voltage higher with respect to cathode voltage) on the memory cell as was used to program the memory cell. Similarly, the bidirectional sensing circuit can allow for an erase verify to be performed using a same reverse bias (cathode voltage higher with respect to anode voltage) on the memory cell as was used to erase the memory cell.

Sensing circuits in particular embodiments also aim to minimize disturbance of the accessed cell resistance during the read operation to determine a data state from that cell. Thus, a cell that is programmed (e.g., in a data state "0") should remain in that state after a program verify or standard read operation, and a cell that is erased (e.g., in a data state "1") should remain in that state after an erase verify or standard read operation. The CBRAM cell may generally be programmed with a forward bias voltage (positive with respect to anode and cathode), and may be erased with a reverse bias voltage (negative with respect to anode and cathode). Various voltages for bit lines and the common anode plate can be supported in particular embodiments. Voltages can also be changed depending on the bias direction (forward or reverse) for a read operation.

Having described the various sections of FIG. 2, one example of the operation of such a memory device will now be described with reference to an operation that accesses memory cell 206-00. Initially, word lines WL0, WL1, . . . WLm can be driven to a deselect voltage (e.g., low) by associated word line drivers. Bit line selection circuitry 104 can place bit lines BL0 and BL1 in the deselected state. Similarly, common plate selection circuitry 106 can place common anode plates in the deselect state.

In a program operation, in response to address and mode data, bit line selection signals can be used to connect a selected bit line to read/write control circuitry via data select 204. In contrast, other bit lines can be deselected, and thus placed in the deselected state. Mode selection values can result in read/write control circuitry connecting the selected bit line (e.g., BL0) to a cathode program voltage. A program operation can also include anode plate voltage VAN being connected to a program voltage, while connecting the selected bit line is grounded. A word line driver corresponding to the selected memory cell can be driven to a select voltage, thereby placing the selected memory cell between suitable programming voltages.

An erase operation can occur in the same general fashion, but with the erase voltage being applied to the selected bit line and common anode voltage VAN. As noted in the example of FIG. 1, in particular embodiments, such an operation can be symmetrical. Also, while FIG. 2 shows n-channel MOS transistors 210 as access devices, other embodiments may include different types of access devices. In such alternate embodiments, associated word line drivers would provide appropriate voltage and/or currents to enable such access devices. In this way, bit line selection, anode plate selection, and word line activation can be utilized to program and/or erase a CBRAM array having bit lines connected to cathodes of CBRAMs within multiple memory cells.

While particular example architectures and circuits suitable for CBRAMs, and memory arrays formed thereof, with respect to FIGS. 1 and 2, programmable impedance elements in certain embodiments are suitable to a wide variety of architectures and/or circuit arrangements.

Figure 3:
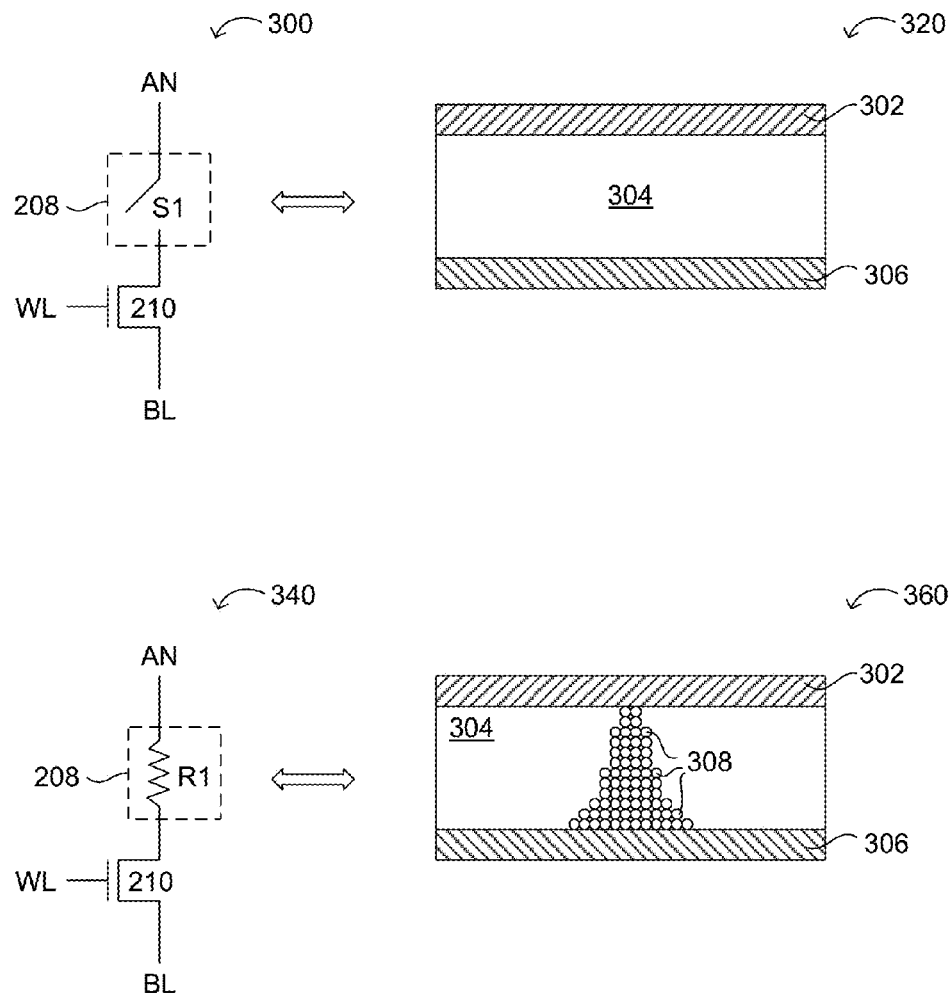
FIG. 3 is a diagram of an example programmable impedance element with schematic modeling.

Referring now to FIG. 3, shown is a diagram of an example programmable impedance element with schematic modeling. For example, example 300 shows a memory cell with an open switch 51 representation of programmable impedance element 208. The programmable impedance element or CBRAM storage element portion of this representation corresponds to the cross-section diagram 320, which represents a resistive storage element in a high impedance state (e.g., data state "1"), or an erased state. Particular embodiments can also include any type of resistive switching or resistance-change memory cells or elements. In one example, CBRAM storage element 320 can include electrochemically active electrode 302, solid electrolyte 304, and inert electrode 306. The example CBRAM storage element 320 may represent a strong or substantially erased state of the cell. As shown, substantially no conductive path between active electrode 302 and inert electrode 306 is seen in CBRAM storage element 320.

Schematic representation 340 and corresponding cross-section diagram 360 show examples of CBRAM storage element 208 in a low impedance state (e.g., data state "0"), or a programmed state. For example, example 340 shows a memory cell with a resistor R1 or closed switch representation of CBRAM storage element 208. The CBRAM storage element portion of this representation corresponds to the cross-section diagram 360. In the example 360, electrodeposits 308 can form in solid electrolyte 304 to form a "bridge" or conductive path between electrochemically active electrode 302 and inert electrode 306 to program the memory cell. For example, electrodeposits 308 can be from active electrode 302, and may include silver, copper, titanium, or tellurium, as just a few examples. As shown in example CBRAM storage element 360, a full conductive path may be formed between active electrode 302 and inert electrode 306 by electrodeposits 308.

As shown in examples 300 and 340, a control transistor (e.g., 210) can also be included in each memory cell including the programmable impedance element or CBRAM storage element 208. For example, transistor 210 can be controlled by a word line, as discussed above with respect to FIG. 2. Transistor 210 may be an access transistor to allow CBRAM storage element 208 to be programmed, read, and erased.

Cell data can be erased in similar fashion to cell programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a CBRAM storage element may be substantially symmetric to a program operation.

Example Resistive Memory Cells with Analog Signal Controlled Transmission Gate Access A transistor used in a one transistor/one resistor (1T1R) configuration can suffer from back bias effects, such as either in a program or an erase operation of a resistive switching memory cell. This can lead to unbalanced control relative to at least one of the states of the memory cell. One CBRAM configuration that corresponds to the 1T1R configuration can be with an NMOS access device connected to the cathode of the programmable impedance element, as shown in FIG. 2. While programming, the source (BL) of the NMOS access device can be held low (e.g., about the same bias as the substrate), and the anode may be held high. However, while erasing, the source (BL) can be held high (e.g., about 2.5V), and this can effectively back bias the NMOS device as the device may be operated in a source follower mode. In this type of arrangement, good program control, but poor erase capability, can occur. In other arrangements, such as using only PMOS access devices and/or changing the CBRAM stack (e.g., switching anode and cathode orientations), a similar type of problem can occur (e.g., good erase control, but poor program control).

In one embodiment, a semiconductor memory device includes a plurality of resistive switching memory cells, where each resistive switching memory cell can include: (i) a programmable impedance element having an anode and a cathode; (ii) a word line pair configured to control access to the programmable impedance element, where the word line pair comprises first and second word lines; (iii) a PMOS transistor having a source coupled to the cathode, a drain coupled to a bit line, and a gate coupled to the first word line; and (iv) an NMOS transistor having a source coupled to the bit line, a drain coupled to the cathode, and a gate coupled to the second word line.

In one embodiment, a semiconductor memory device includes a plurality of resistive switching memory cells, where each resistive switching memory cell can include: (i) a programmable impedance element having an anode and a cathode; (ii) a word line pair configured to control access to the programmable impedance element, wherein the word line pair comprises first and second word lines; (iii) a PMOS transistor having a source coupled to a bit line, a drain coupled to the anode, and a gate coupled to the first word line; and (iv) an NMOS transistor having a drain coupled to the bit line, a source coupled to the anode, and a gate coupled to the second word line.

Figure 4:
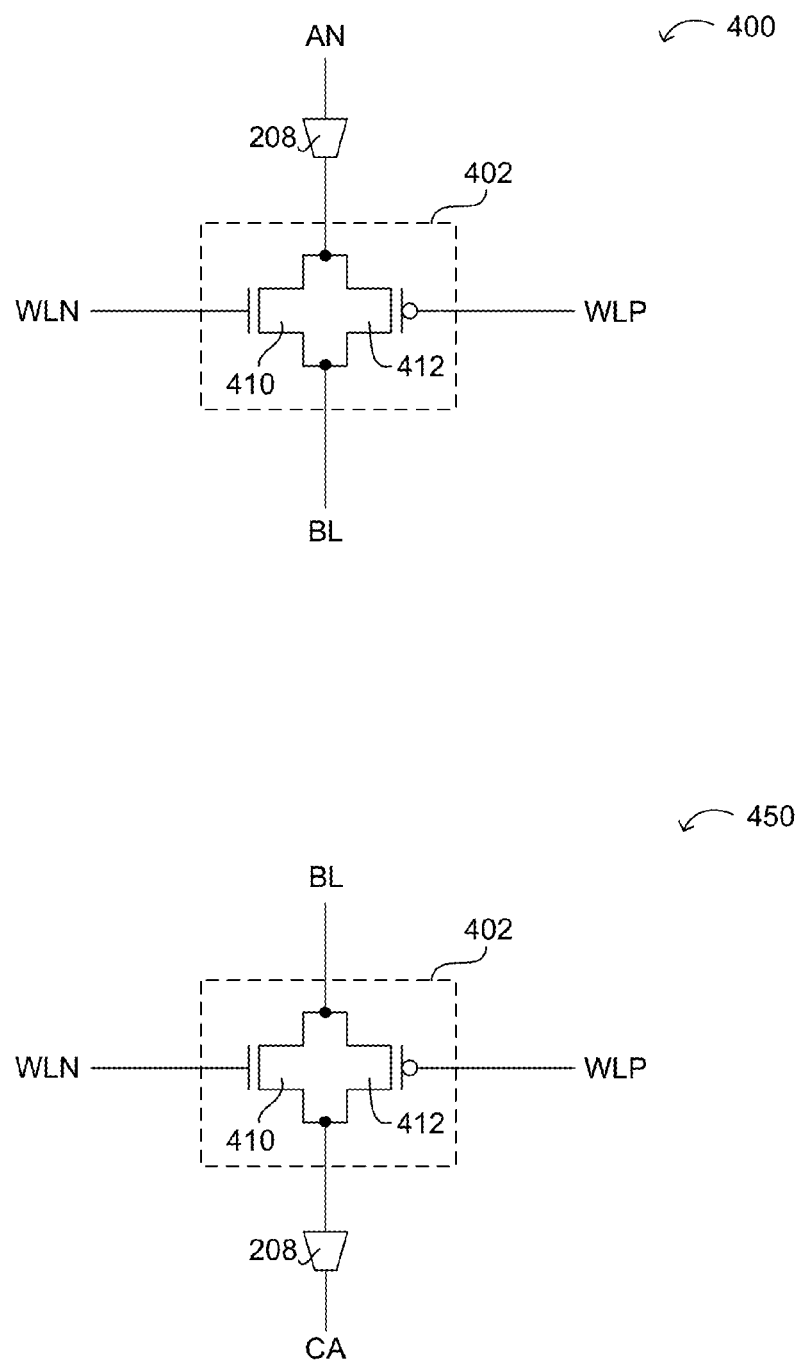
FIG. 4 is schematic block diagram of example resistive switching memory cells, in accordance with embodiments of the present invention.

Referring now to FIG. 4, shown is schematic block diagram of example resistive switching memory cells, in accordance with embodiments of the present invention. In 400, a resistive switching memory cell configured for a common anode structure is shown, and in 450 a memory cell configured for a common cathode structure is shown. Thus in 400, a common anode plate can connect to the anode (AN) of programmable impedance element 208, as well as to other cells in an array or grouping of memory cells. The cathode of programmable impedance element 208 can connect to analog signal controlled transmission gate 402. Also, a pair of word lines (e.g., WLN and WLP) can be used to control transmission gate 402.

In particular embodiments, the transmission gate may be referred to as "analog signal controlled" because the signals applied to word lines WLN/WLP may not strictly be digital signals. Rather, this word line pair can be controlled so as to bias and/or turn on the respective transistors with relatively low voltages, as compared to other approaches. In some cases, the voltages applied to word lines WLN/WLP may not be rail-to-rail type digital signals, and instead may be controlled levels with voltages that are less than the supply rails. Thus, certain embodiments are particularly suitable for low-voltage applications.

In example 400, transmission gate 402 can include NMOS transistor 410 and PMOS transistor 412. A source of NMOS transistor 410 can connect to the bit line (BL), and a drain of NMOS transistor 410 can connect to the cathode of programmable impedance element 208. Also, the gate of NMOS transistor 410 can connect to word line WLN. A source of PMOS transistor 412 can connect to the bit line, and a drain of PMOS transistor 412 can connect to the cathode of programmable impedance element 208. In addition, the gate of PMOS transistor 412 can connect to word line WLP. In this arrangement, word lines WLN/WLP can be controlled to enable access to programmable impedance element 208 via transmission gate 402. Also, the memory cell can be programmed, erased, or read based on the voltage levels applied to the anode plate and the bit line.

Various types of transistors can be utilized in an analog signal controlled transmission gate in particular embodiments. Any suitable type of MOS or other complementary (e.g., P-type and N-type) transistors can be employed in analog signal controlled transmission gate 402. For example, FinFET transistors can be used to implement transistors 410 and 412. Other examples include double or multi-gate transistors, tri-gate transistors, and gate-all-around (GAA) FET transistors, to name just a few. In any event, particular embodiments can include a pair of word lines to control access to storage element 208 via the transmission gate.

Example 450 shows a resistive switching memory cell configured for a common cathode (CA) array structure. Here, a drain of NMOS transistor 410 can connect to the bit line, and a source of NMOS transistor 410 can connect to the anode of programmable impedance element 208. Also, a gate of NMOS transistor 410 can connect word line WLN. A source of PMOS transistor 412 can connect to the bit line, and a drain of PMOS transistor 412 can connect to the anode of programmable impedance element 208. Also, a gate PMOS transistor 412 can connect to word line WLP. In this arrangement, word lines WLN/WLP can be controlled to enable access to programmable impedance element 208 via transmission gate 402. Also, the memory cell can be programmed, erased, or read based on the voltage levels applied to the anode plate and the bit line.

Thus, a variety of circuit arrangements can be utilized to provide transmission gate-based access to programmable impedance element 208. In some cases, process flow characteristics may determine whether a common anode cell structure (e.g., 400) or a common cathode structure (e.g., 450) is most suitable for a given application. In any event, use of a transmission gate as an access structure can allow for substantially symmetric program and erase operations for a resistive switching memory cell. This is in contrast to conventional approaches, where either the erase operation (e.g., with a single PMOS transistor) or program operation (e.g., with a single NMOS transistor) may need a relatively high overdrive in order to overcome the increase in transistor threshold voltage due to the back bias effect.

The back bias effect can come into play due to increased source to body voltage differences, even where the body (e.g., P-substrate) is grounded. However, in particular embodiments, an analog signal controlled transmission gate can effectively pass both low and high voltages with equal efficiency, thus allowing for improved control over both program and erase states. This approach may also accommodate the use of overall lower voltages because the back bias effect of one transistor can be shunted by the other transistor that is connected in parallel. In addition, while the other device (e.g., NMOS transistor 410 while erasing) may be relatively inefficient, this device may still add to the overall drive current in parallel over a portion of the operating voltage range.

Figure 5:
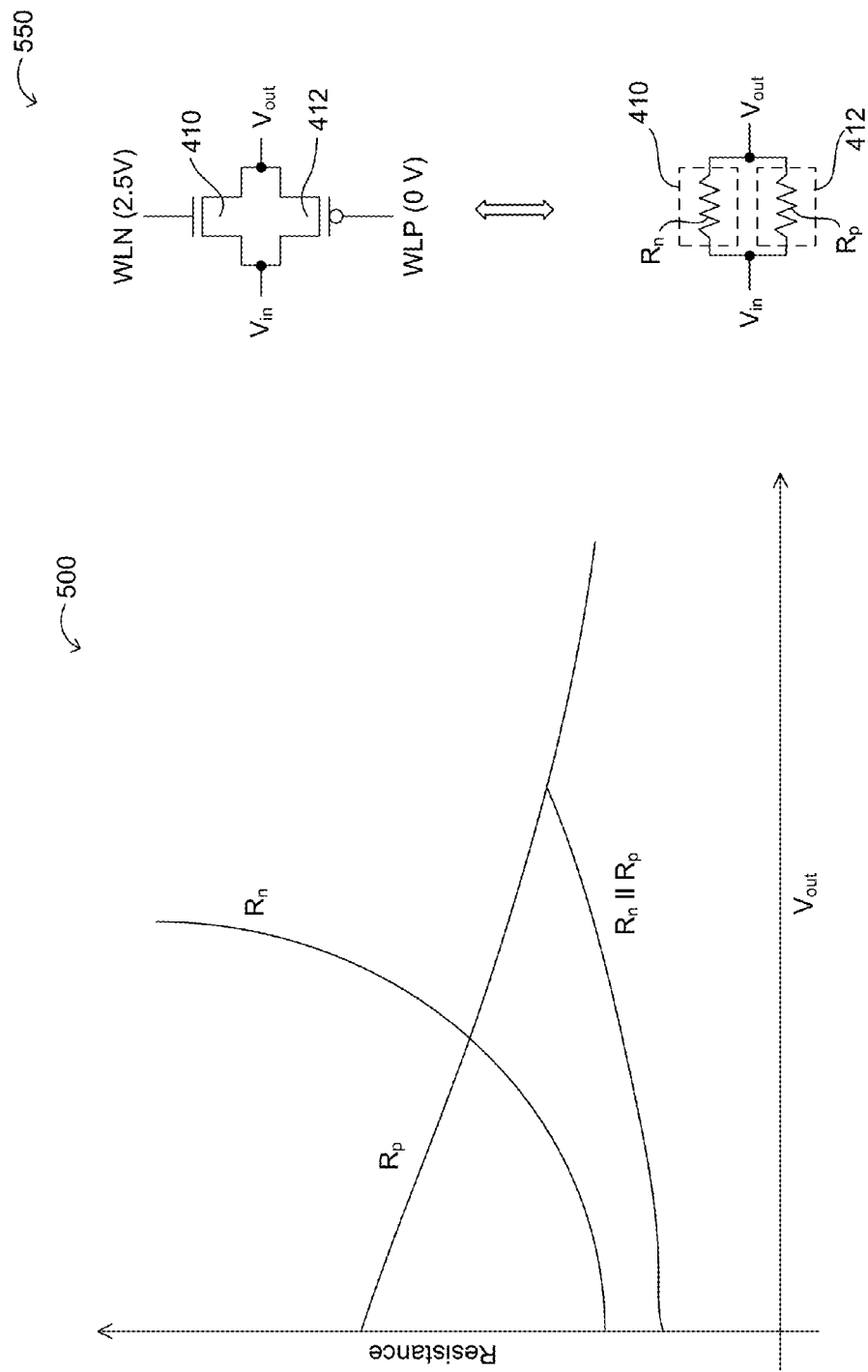
FIG. 5 is a diagram of example analog signal controlled transmission gate operation, in accordance with embodiments of the present invention.

Referring now to FIG. 5, shown is a diagram of example analog signal controlled transmission gate operation, in accordance with embodiments of the present invention. Diagram 500 shows a transmission gate or "Rn∥Rp" curve in the plot of the combined output resistance of the transmission gate, which may remain relatively low for all values of the gate drive. As shown in 550, NMOS transistor 410 and PMOS transistor 412 may be connected in parallel with source/drain regions between $V_{in}$ and $V_{out}$. In this particular example, word line WLN and one source/drain terminal (e.g., $V_{in}$) may be about 2.5V (e.g., a program voltage), while word line WLP can be grounded.

In 500, resistance is plotted against output voltage $V_{out}$ at the other source/drain terminal. In some cases, transistors 410 and 412 can be turned on/off substantially simultaneously, while in other cases there may be a delay time or voltage delta intentionally introduced in one of the control signal paths. Also, while certain examples are directed to analog signal based control of NMOS transistor 410 and PMOS transistor 412, these transistors may also be controlled by digital control circuitry in some cases. In any event, the transmission gate including transistors 410 and 412 can be used to effectively pass both high and low values in either direction, and with symmetrical operation and efficiency.

Figure 6:
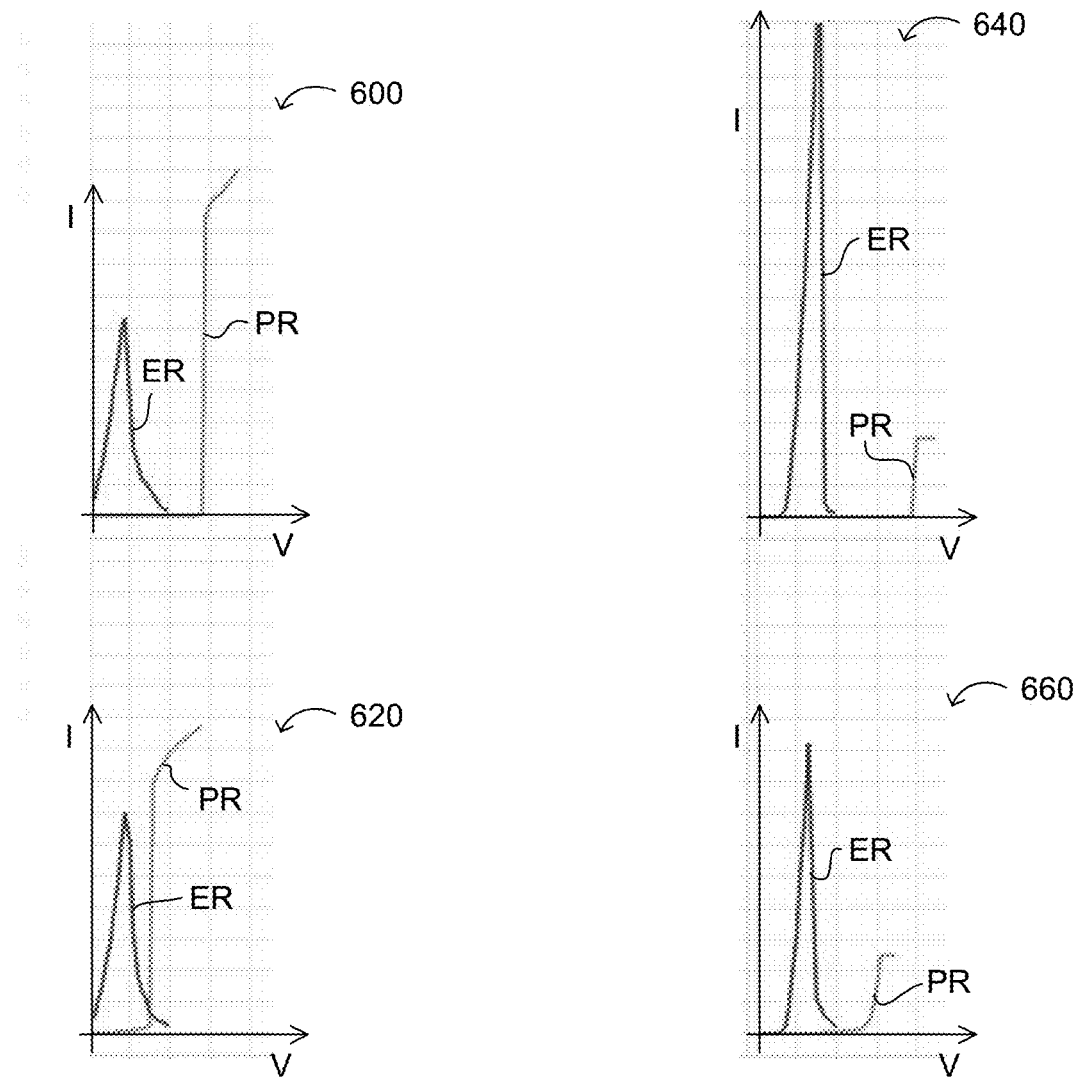
FIG. 6 is a waveform diagram of example NMOS and PMOS access transistor operation, in accordance with embodiments of the present invention.

Referring now to FIG. 6, shown is a waveform diagram of example NMOS and PMOS access transistor operation, in accordance with embodiments of the present invention. These example plots show DC IV sweeps of example CBRAM cells using NMOS and PMOS access transistors at a forming cycle, as well as at a $10^{th}$ cycle, which may indicate ongoing operating characteristics. Depending upon NMOS or PMOS access transistors, the particular erase or program operations, may be impacted. Example 600 shows an IV curve of an NMOS access transistor for a forming cycle for erase (ER) and program (PR) operations. Example 620 shows an IV curve of an NMOS access transistor for a $10^{th}$ cycle for ER and PR operations. Example 640 shows an IV curve of a PMOS access transistor for a forming cycle for ER and PR operations. Also, example 660 shows an IV curve of a PMOS access transistor for a $10^{th}$ cycle for ER and PR operations.

As shown, the $10^{th}$ cycle for program may take about 1.5V lower voltage as compared to the corresponding forming cycle. In addition, the current at the end of a program operation, or the beginning of an erase operation may be very different, even after the transistors are appropriately sized to account for NMOS versus PMOS strengths. PMOS transistors may deliver a higher peak erase current at a beginning of an erase operation, while NMOS transistors may provide a higher program or "soak" current at the end of a program. In particular embodiments, optimal analog signal controlled transmission gate performance, such as for a CBRAM cell can be obtained by appropriate sizing of the NMOS (e.g., 410) and PMOS (e.g., 412) devices.

Figure 7:
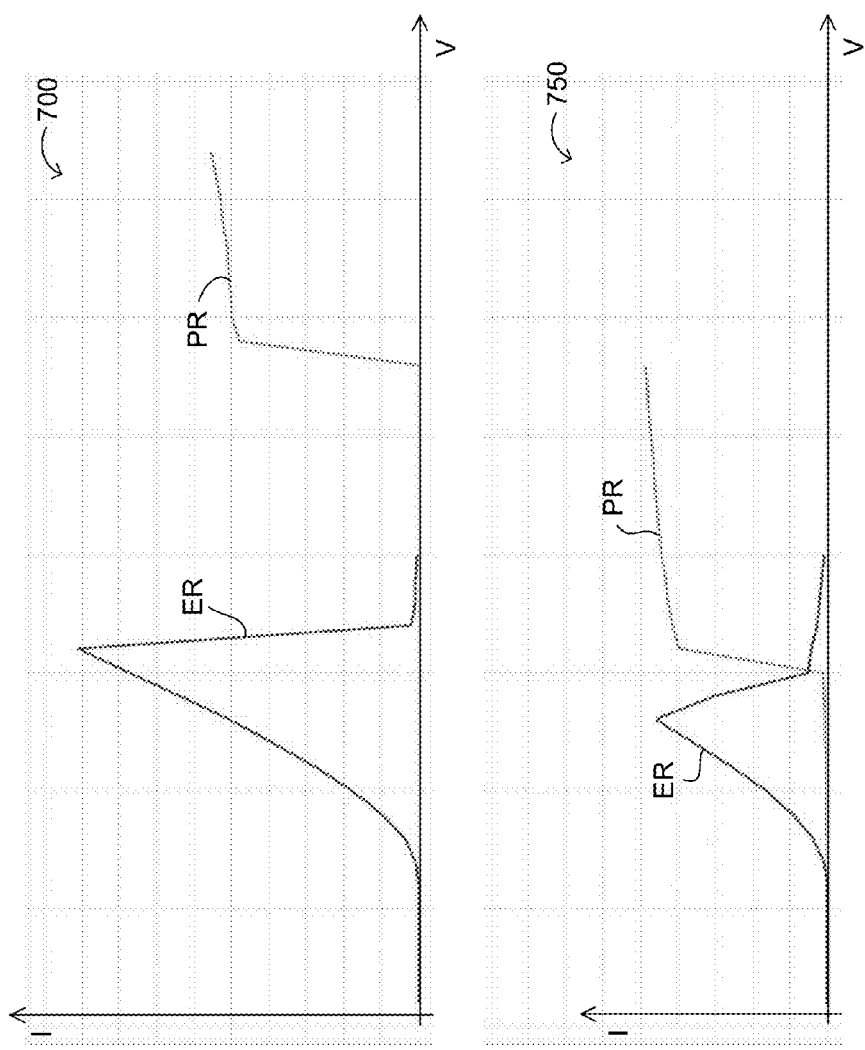
FIG. 7 is a waveform diagram of an example analog signal controlled transmission gate access transistor operation, in accordance with embodiments of the present invention.

Referring now to FIG. 7, shown is a waveform diagram of an example analog signal controlled transmission gate access transistor operation, in accordance with embodiments of the present invention. Example 700 shows an IV curve of a forming cycle for PR and ER operations for a transmission gate. Example 750 shows an IV curve of a $10^{th}$ cycle for PR and ER operations for the transmission gate arrangement. The PR operation can substantially occur at NMOS capabilities (e.g., form at about 2.8V, and $10^{th}$ cycle PR at about 1.5V). The ER operation can substantially occur at PMOS values (e.g., form at about 1.6V, and $10^{th}$ cycle ER at about 1.3V). For example, the ER operation may also have a capability of a higher peak erase current for a formation ER cycle at about 180 uA, and for the $10^{th}$ cycle ER at about 90 uA. Such values can be optimized by choosing bit line and anode voltages to provide best performance.

Figure 8:
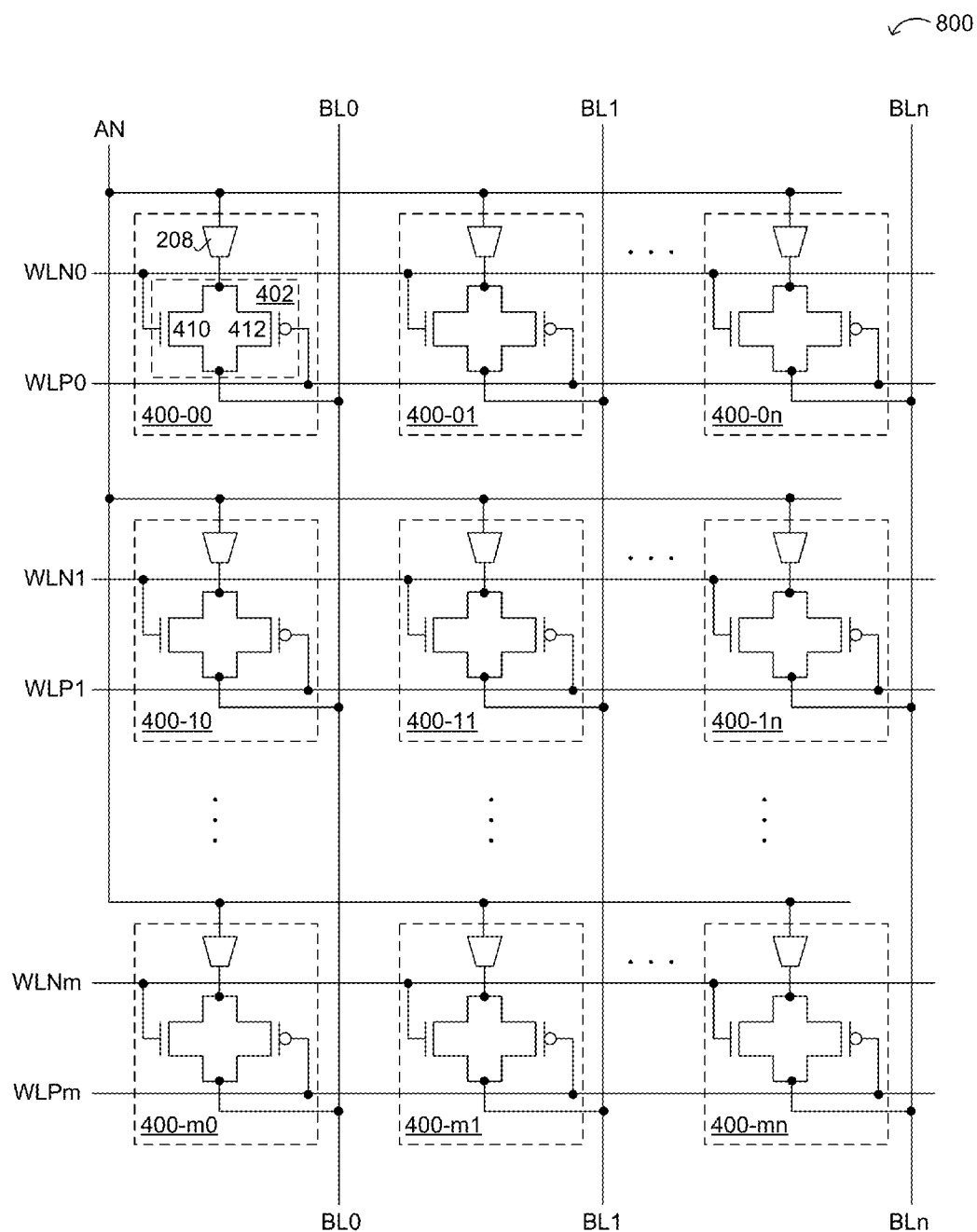
FIG. 8 is a schematic block diagram of an example resistive switching memory array, in accordance with embodiments of the present invention.

Referring now to FIG. 8, shown is a schematic block diagram of an example resistive switching memory array 800, in accordance with embodiments of the present invention. In this example, resistive switching memory cells 400 can include programmable impedance element 208 and access transmission gate 402, as shown. In this particular arrangement, the anode of each memory cell 400 can connect together in a common anode structure. For example, the common anode (AN) can be a large plate structure that may be biased at a voltage (e.g., VAN) that may be generated by voltage control 202 (see, e.g., FIG. 2). Of course, other voltage generation control and regulated levels, as discussed above, can be utilized in certain embodiments.

As shown in this particular example, common anode plates (AN) can be shared by multiple CBRAM cells. Along these lines, each memory array or array block may have multiple such anode plates (ANs). In addition, word lines and bit lines can be arranged in an orthogonal fashion for accessing individual CBRAM or other such resistive memory cells. Of course, any number of anode plates, anode plate voltages (VANs), memory array or array block sizes, and/or memory array arrangements, etc., can be supported in particular embodiments.

A row of resistive switching memory cells can include memory cells (e.g., 400-00, 400-01, . . . 400-0n) that correspond to a word line pair (e.g., WLN0/WLP0). Similarly, the array can include an adjacent row of memory cells (e.g., 400-10, 400-11, . . . 400-1n) that correspond to a word line pair (e.g., WLN1/WLP1), and so on through an "m" row of memory cells (e.g., 400-m0, 400-m1, . . . 400-mn) that correspond to a word line pair (e.g., WLNm/WLPm). Columns of resistive switching memory cells can be aligned along a common bit line, such as memory cells (e.g., 400-00, 400-10, . . . 400-m0) that correspond to bit line BL0. Similarly, an adjacent column can include memory cells (e.g., 400-01, 400-11, . . . 400-m1) arranged along a common bit line BL1, and so on through column "n" that may include memory cells (e.g., 400-0n, 400-1n, . . . 400-mn) arranged along common bit line BLn. Any number of rows, columns, as well as array block or other arrangement of resistive switching memory cells can be accommodated in particular embodiments.

Data select 204 (see, e.g., FIG. 2) can provide an interface between the bit lines (BL0, BL1, . . . BLn) and a data path that is coupled to a sensing or amplification block, as well as to write circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed and decoded. In addition, word line pair (WLN0/WLP0, WLN1/WLP1, . . . WLNm/WLPm) decoding (e.g., via WL decode 110) can be utilized for activation of the appropriate word line pair for a given cycle.

As discussed above, a reference path can also be coupled to the data select circuitry in some cases. The reference path can be used by a sensing circuit in order to compare against a regular bit line. For example, a current from a selected bit line and its selected memory cell 400 can be compared against a current from a reference bit line, where the reference bit line is biased such that appropriate data states on the selected memory cell via the selected bit line can be detected. In one application, the capacitance on the reference bit line and reference memory cell structure can match the capacitance on a regular memory cell/bit line such that these effects are negated during the sensing process.

Other architectures can also be employed with sensing circuitry, arrangements, and methods of particular embodiments. For example, a common cathode structure (see, e.g., memory cell arrangement 450), whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is a strapped source structure. In any event, particular embodiments are suitable to a wide variety of resistive memory cell architectures and arrangements.

The data select circuitry discussed above can also receive operation control signals. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. For example, a common bidirectional sensing circuit can be employed in each of these operations. In particular, the bidirectional sensing circuit can allow for a program verify to be performed using a same forward bias (anode voltage higher with respect to cathode voltage) on the memory cell as was used to program the memory cell. Similarly, the bidirectional sensing circuit can allow for an erase verify to be performed using a same reverse bias (cathode voltage higher with respect to anode voltage) on the memory cell as was used to erase the memory cell.

Sensing circuits in particular embodiments also aim to minimize disturbance of the accessed cell resistance during the read operation to determine a data state from that cell. Thus, a cell that is programmed (e.g., in a data state "0") should remain in that state after a program verify or standard read operation, and a cell that is erased (e.g., in a data state "1") should remain in that state after an erase verify or standard read operation. The CBRAM cell may generally be programmed with a forward bias voltage (positive with respect to anode and cathode), and may be erased with a reverse bias voltage (negative with respect to anode and cathode). Various voltages for bit lines and the common anode plate can be supported in particular embodiments. Voltages can also be changed depending on the bias direction (forward or reverse) for a read operation.

Having described the various sections of FIG. 8, one example of the operation of such a memory device will now be described with reference to an operation that accesses memory cell 400-00. Initially, word lines WLN0/WLP0, WLN1/WLP1, . . . WLNm/WLPm can be driven to a deselect voltage by associated word line drivers (see, e.g., 1102 in FIG. 11). For example, word lines WLN0, WLN1, . . . WLNm can be driven to a low level deselect voltage (e.g., 0V) to ensure that corresponding NMOS access transistors 410 are off, while word lines WLP0, WLP1, . . . WLPm can be driven to a high level deselect voltage (e.g., VDD) to ensure that corresponding PMOS access transistors 412 are off. Bit line selection circuitry 104 can also place bit lines BL0 and BL1 in the deselected state. Similarly, common plate selection circuitry 106 can place common anode plates in the deselect state. For example, an intermediate common voltage (e.g., about 1.2V can be a deselect voltage for both the common anode plate and the bit lines.

In a program operation, in response to address and mode data, bit line selection signals can be used to connect a selected bit line to read/write control circuitry via data select 204. In contrast, other bit lines can be deselected, and thus placed in the deselected state. Mode selection values can result in read/write control circuitry connecting the selected bit line (e.g., BL0) to a cathode program voltage. A program operation can also include anode plate voltage AN being connected to a program voltage, while connecting the selected bit line is grounded. A word line driver corresponding to the selected memory cell can be driven to a pair of select voltages for the corresponding WLN/WLP, thereby placing the selected memory cell between suitable programming voltages.

An erase operation can occur in the same general fashion, but with the erase voltage being applied to the selected bit line and common anode voltage VAN. As noted above, such an operation can be symmetrical. While particular example architectures and circuits suitable for CBRAMs, and memory arrays formed thereof, with respect to FIGS. 1, 2, and 8, programmable impedance elements in certain embodiments are suitable to a wide variety of architectures and/or circuit arrangements.

Figure 9:
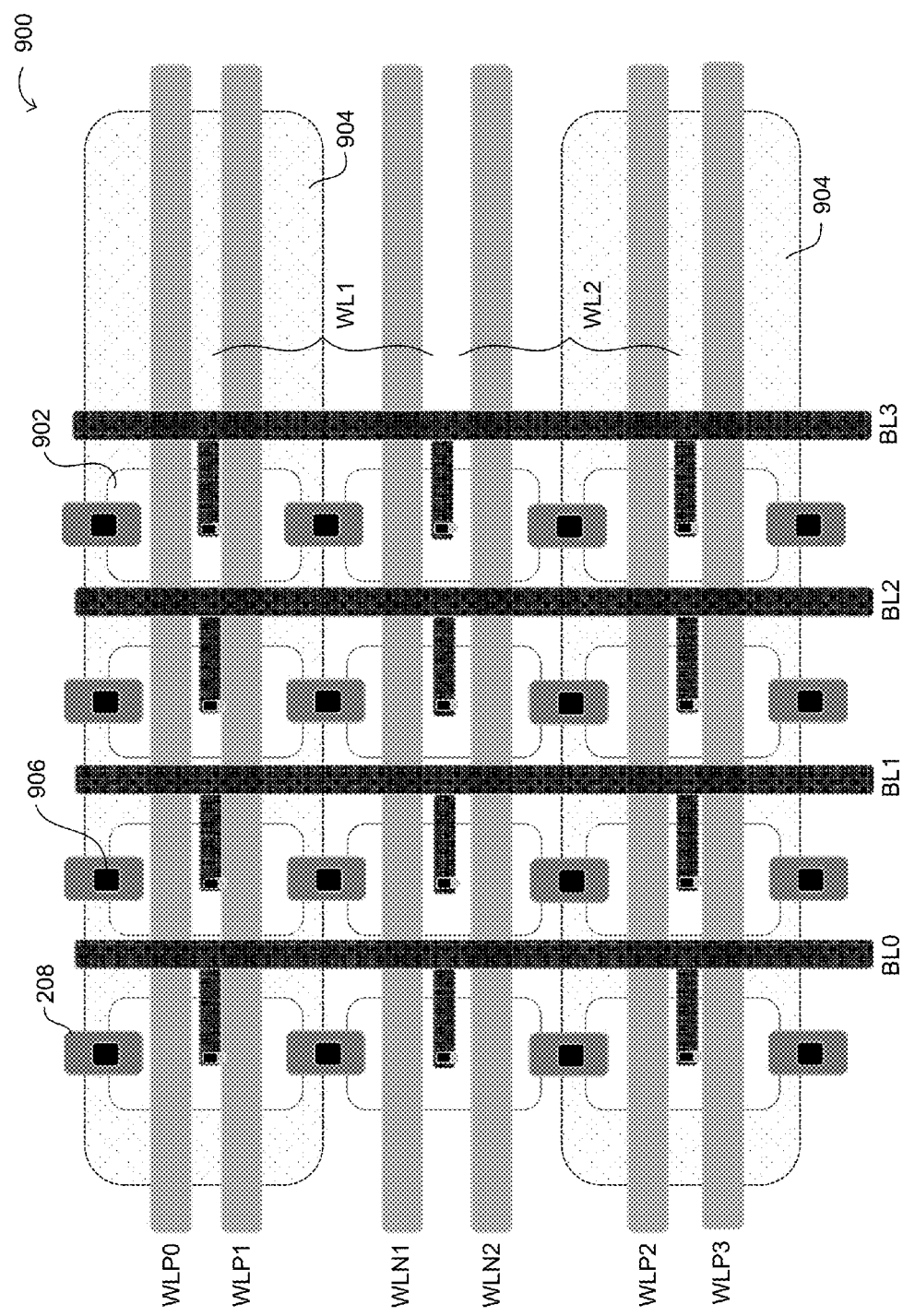
FIG. 9 is a diagram of an example layout of a resistive switching memory array using analog signal controlled transmission gates, in accordance with embodiments of the present invention.

Referring now to FIG. 9, shown is a diagram of an example layout 900 of a resistive switching memory array using analog signal controlled transmission gates, in accordance with embodiments of the present invention. In this example, active regions 902 can be used to form PMOS transistors 412 in N-well regions 904, and NMOS transistors 410 in the remaining P-substrate regions. Word line pair WL1 can be aligned as shown, and may include word line WLN1 connected to the gates of corresponding NMOS transistors 410, and word line WLP1 connected to the gates of corresponding PMOS transistors 412. Similarly, word line pair WL2 can be aligned as shown, and may include word line WLN2 connected to the gates of corresponding NMOS transistors 410, and word line WLP2 connected to the gates of corresponding PMOS transistors 412.

The bit lines (e.g., BL0, BL1, BL2, BL3) may be formed orthogonal to the word lines, and in a different layer (e.g., a different metal layer). Also, programmable impedance element 208 can include contact 906, which can connect to the common anode plate (e.g., in a higher metal layer). Of course, any other suitable layout configurations can also be accommodated in particular embodiments. Further, if different types of transistors (e.g., FinFET devices) are employed, the layout structure as well as different layers or materials being used for different circuit structures (e.g., metal gates versus polysilicon gates) can result in other layout variations.

Figure 10:
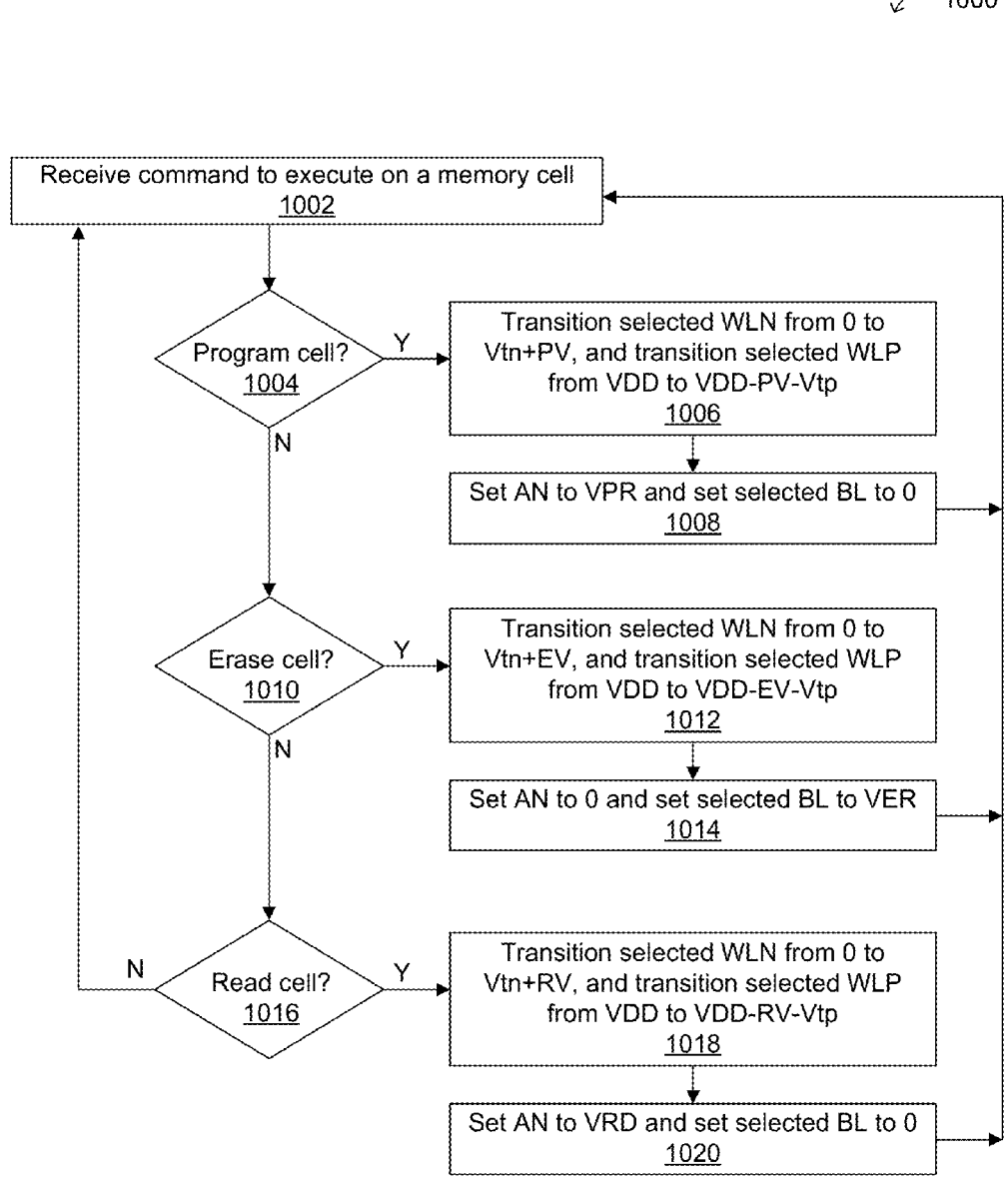
FIG. 10 is a flow diagram of example operation of a resistive switching memory array using analog signal controlled transmission gates, in accordance with embodiments of the present invention.

Referring now to FIG. 10, shown is a flow diagram 1000 of example operation of a resistive switching memory array using analog signal controlled transmission gates, in accordance with embodiments of the present invention. At 1002, a command to be executed on a resistive memory cell can be received. For example, command decoder 120 (see, e.g., FIG. 1) can provide an indication of whether the command is a program, erase, or read (e.g., program verify or erase verify) command. At 1004, if a cell is to be programmed, at 1006, selected word line WLN can be transitioned from 0V to about an NMOS transistor threshold voltage plus a predetermined value (e.g., Vtn+PV). Also at 1006, word line WLP can be transitioned from VDD to about a PMOS transistor threshold voltage and the predetermined value below VDD (e.g., VDD-PV-Vtp). At 1008, the anode plate (AN) voltage can be set to the programming voltage (VPR), and selected bit lines can be set to about 0V. In this way, a selected resistive memory cell at an intersection of selected word lines and bit lines can be programmed by providing the program voltage (e.g., about 2-2.5V) in a forward bias direction across the anode and cathode of the programmable impedance element.

At 1010, if a cell is to be erased, at 1012, selected word line WLN can be transitioned from 0V to about Vtn+EV. In this case, "EV" can represent a predetermined value for erase operations. Also at 1012, word line WLP can be transitioned from VDD to about VDD-EV-Vtp. At 1014, the anode plate can be set to about 0V, and selected bit lines can be set to the erase voltage (VER). In this way, a selected resistive memory cell at an intersection of selected word lines and bit lines can be erased by providing the erase voltage (e.g., about 2-2.5V) in a reverse bias direction across the anode and cathode of the programmable impedance element.

At 1016, if a cell is to be read (e.g., for a program or erase verify), at 1018, selected word line WLN can be transitioned from 0V to about Vtn+RV. In this case, "RV" can represent a predetermined value for read or verify operations. Also at 1018, word line WLP can be transitioned from VDD to about VDD-RV-Vtp. At 1020, the anode plate can be set to the read voltage (VRD), and the selected bit lines can be set to about 0V. In this way, a selected resistive memory cell at an intersection of selected word lines and bit lines can be sensed by providing a sufficient read voltage (e.g., in a forward bias direction) across the anode and cathode of the programmable impedance element.

Figure 11:
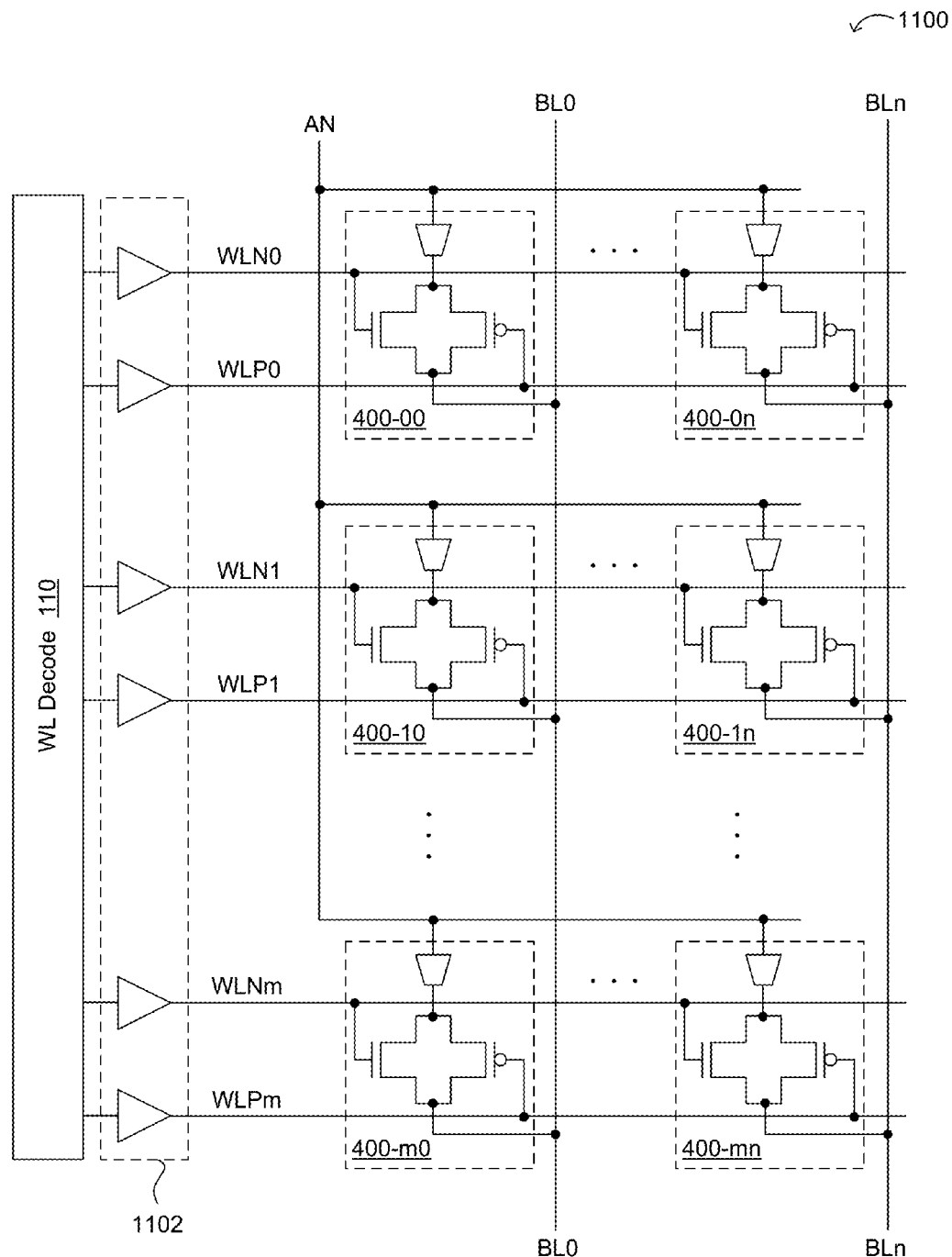
FIG. 11 is a schematic block diagram of an example resistive switching memory array with independently controlled word line drivers, in accordance with embodiments of the present invention.

Referring now to FIG. 11, shown is a schematic block diagram of an example resistive switching memory array 1100 with independently controlled word line drivers, in accordance with embodiments of the present invention. In this particular example, WL decode 110 and/or WL drivers 1102 can receive various supply voltages (e.g., VDD, VSS, VREF, etc.), as well as operation controls (e.g., program, erase, verify, read, etc.). Based on these control signals and the results of address decoding, word line drivers 1102 can control the voltage levels on the various word lines (e.g., WLN0/WLP0, WLN1/WLP1, . . . WLNm/WLPm). In this way, each word line can be independently controlled to take advantage of the transmission gate access structure.

For example, word line drivers 1102 can include reference circuitry, such as may include reference transistors that correspond to NMOS access transistor 410 and PMOS access transistor 412. In addition, word line drivers 1102 can include bias or regulation circuitry (e.g., a bandgap reference circuit) in order to generate a suitable predetermined voltage level across process/voltage/temperature variations. Further, word line drivers 1102 can include other suitable circuitry to shape the particular waveforms of the word line signals. In some cases, a ramp signal generator, or other such circuitry, can be employed to control the ramp rate of the various word line signals. In any event, particular embodiments support analog signal based control via word line decoder 110 and word line drivers 1102.

Word line drivers 1102 can accommodate any suitable type of control of NMOS access transistor 410 and PMOS access transistor 412. In one example, which may be applicable to test/characterization flows, only one of word line WLN/WLP may be activated at a given time. In this case, a word line WLN (e.g., WLN1) may be brought sufficiently high to turn on corresponding NMOS transistor 410, while the corresponding word line WLP (e.g., WLP1) remains high to keep corresponding PMOS transistor 412 in an off state. Similarly, word line WLP (e.g., WLP1) may be brought sufficiently low to turn on corresponding PMOS transistor 412, while the corresponding word line WLN (e.g., WLN1) remains low to keep corresponding NMOS transistor 410 in an off state. However, in most cases, corresponding word lines WLN and WLP in a word line pair may be controlled to turn on/off at substantially a same time.

Figure 12:
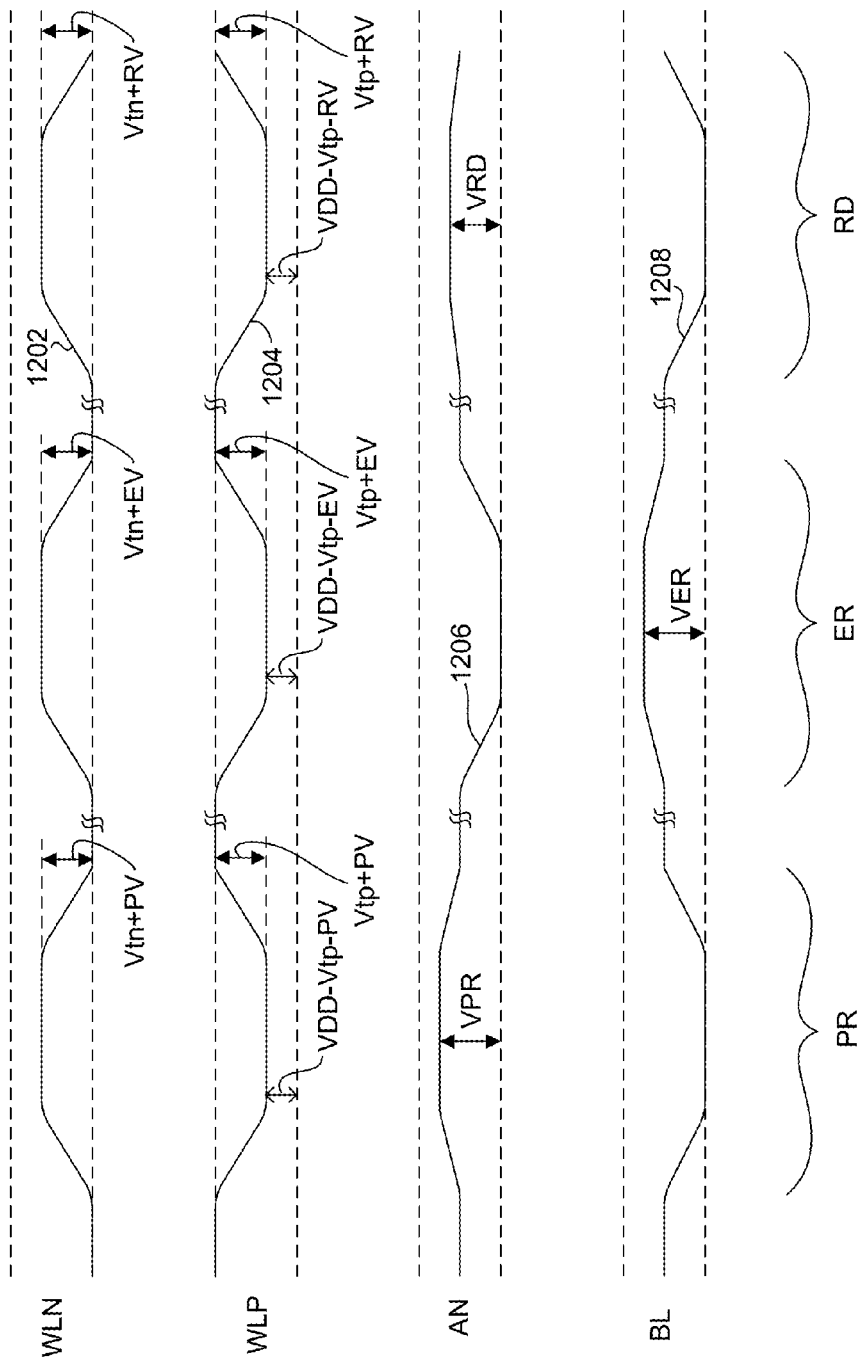
FIG. 12 is a waveform diagram of example operation of a resistive switching memory cell with an analog signal controlled transmission gate, in accordance with embodiments of the present invention.

Referring now to FIG. 12, shown is a waveform diagram of example operation of a resistive switching memory cell with an analog signal controlled transmission gate, in accordance with embodiments of the present invention. Shown here are example program (PR), erase (ER), and read or verify (RD) operations. In an example program operation, selected word line WLN (see, e.g., waveform 1202) can transition from 0V to about an NMOS transistor threshold voltage plus a predetermined value (e.g., Vtn+PV). Also, word line WLP (see, e.g., waveform 1204) can transition from VDD to about a PMOS transistor threshold voltage and the predetermined value below VDD (e.g., VDD-PV-Vtp). In particular embodiments, these word line transitions can occur at a controlled rate (e.g., a controlled slew rate), and the predetermined value can be adjusted. In addition, the anode plate (AN) voltage (see, e.g., waveform 1206) can be set to the programming voltage (VPR), and a selected bit line (see, e.g., waveform 1208) can be set to about 0V. In this way, the programming voltage can be applied in a forward bias fashion across the programmable impedance element, such as to potentially change the state of the resistive switching memory cell to a low impedance state (e.g., data state "0").

During an example erase operation, selected word line WLN can go from 0V to about Vtn+EV, and word line WLP can go from VDD to about VDD-EV-Vtp to access the programmable impedance element. The anode plate can be set to about 0V, and a selected bit line BL can be set to the erase voltage (VER). In this way, the erase voltage can be applied in a reverse bias fashion across the programmable impedance element, such as to potentially change the state of the resistive switching memory cell to a high impedance state (e.g., data state "1"). In a read operation (e.g., for a program or erase verify), word line WLN can go from 0V to about Vtn+RV, and word line WLP can be transitioned from VDD to about VDD-RV-Vtp to access the programmable impedance element.

In particular embodiments, these word line transitions for erase and read operations can occur at a controlled rate (e.g., a controlled slew rate), and the predetermined value can be adjusted. The anode plate can be set to the read voltage (VRD), and the selected bit lines can be set to about 0V, as shown. The data state can be read from (e.g., using sensing circuitry) the resistive switching memory cell, such as in order to determine whether a previous program or erase operation successfully executed. Depending on the sensing circuitry utilized, the state of the memory cell can be read based on a forward bias read voltage across the programmable impedance element as shown, and/or the state of the memory cell can be determined based on a reverse bias read voltage.

Resistive switching memory cells as discussed herein may also each support more than one memory state. In addition, depending on the voltage level controls, instead of a full erase or a full program/write, partial operations (e.g., by applying less/predetermined voltages for forward bias and reverse bias of the CBRAM cell, by applying different program current, etc.) can be performed. Such partial operations can produce different resistance and linear/nonlinear values in the cell, as opposed to the cell having an on/off resistance corresponding to two storage states. Instead, a binary coding of, e.g., eight different bands or ranges of CBRAM cell on resistances can be converted into 3-bit storage values. Thus in this example, eight different data values can be stored in a given CBRAM cell. Of course, other numbers of data values can be stored based on the resistance, linearity, bias voltage, and/or current characteristics.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A semiconductor memory device, comprising a plurality of resistive switching memory cells, wherein each resistive switching memory cell comprises:
    a) a programmable impedance element having an anode and a cathode;
    b) a word line pair configured to control access to the programmable impedance element, wherein the word line pair comprises first and second word lines;
    c) a word line driver configured to independently control the first and second word lines;
    d) a PMOS transistor having a first source/drain terminal coupled to the cathode, a second source/drain terminal coupled to a bit line, and a gate coupled to the first word line; and
    e) an NMOS transistor having a first source/drain terminal coupled to the bit line, a second source/drain terminal coupled to the cathode, and a gate coupled to the second word line, wherein the programmable impedance element is configured to be accessed when a first voltage across the first source/drain terminal and the gate of the PMOS transistor reaches a predetermined value greater than a threshold voltage of the PMOS transistor, or a second voltage across the gate and the first source/drain terminal of the NMOS transistor reaches the predetermined value greater than a threshold voltage of the NMOS transistor.

2. The semiconductor memory device of claim 1, wherein the first and second word lines are substantially mirror image waveforms.

3. The semiconductor memory device of claim 1, wherein the first and second voltages reach the predetermined value greater than a corresponding threshold voltage at substantially a same time.

4. The semiconductor memory device of claim 1, wherein the plurality of resistive switching memory cells are coupled together by the anode.

5. The semiconductor memory device of claim 1, wherein each of the PMOS transistor and the NMOS transistor comprises FinFET devices.

6. The semiconductor memory device of claim 1, wherein the programmable impedance element comprises:
    a) an inert electrode coupled to a first side of a solid electrolyte;
    b) an active electrode coupled to a second side of the solid electrolyte, wherein the programmable impedance element is programmed by formation of a conductive path between the active and inert electrodes; and c) a plurality of mobile elements derived from the active electrode, wherein the plurality of mobile elements are reduced in the solid electrolyte to form the conductive path.

7. The semiconductor memory device of claim 6, wherein the conductive path in the programmable impedance element is formed by application of a first voltage across the active and inert electrodes, the conductive path remaining once formed after the first voltage is removed.

8. The semiconductor memory device of claim 6, wherein at least a portion of the conductive path is dissolved to erase the programmable impedance element by application of a second voltage across the active and inert electrodes.

9. A semiconductor memory device, comprising a plurality of resistive switching memory cells, wherein each resistive switching memory cell comprises:
   a) a programmable impedance element having an anode and a cathode;
   b) a word line pair configured to control access to the programmable impedance element, wherein the word line pair comprises first and second word lines;
   c) a word line driver configured to independently control the first and second word lines;
   d) a PMOS transistor having a first source/drain terminal coupled to a bit line, a second source/drain terminal coupled to the anode, and a gate coupled to the first word line; and
   e) an NMOS transistor having a first source/drain terminal coupled to the bit line, a second source/drain terminal coupled to the anode, and a gate coupled to the second word line, wherein the programmable impedance element is configured to be accessed when a first voltage across the first source/drain terminal and the gate of the PMOS transistor reaches a predetermined value greater than a threshold voltage of the PMOS transistor, or a second voltage across the gate and the second source/drain terminal of the NMOS transistor reaches the predetermined value greater than a threshold voltage of the NMOS transistor.

10. The semiconductor memory device of claim 9, wherein the first and second word lines are substantially mirror image waveforms.

11. The semiconductor memory device of claim 9, wherein the first and second voltages reach the predetermined value greater than a corresponding threshold voltage at substantially a same time.

12. The semiconductor memory device of claim 9, wherein the plurality of resistive switching memory cells are coupled together by the cathode.

13. The semiconductor memory device of claim 9, wherein each of the PMOS transistor and the NMOS transistor comprises FinFET devices.

14. The semiconductor memory device of claim 9, wherein the programmable impedance element comprises:
   a) an inert electrode coupled to a first side of a solid electrolyte;
   b) an active electrode coupled to a second side of the solid electrolyte, wherein the programmable impedance element is programmed by formation of a conductive path between the active and inert electrodes; and
   c) a plurality of mobile elements derived from the active electrode, wherein the plurality of mobile elements are reduced in the solid electrolyte to form the conductive path.

15. The semiconductor memory device of claim 14, wherein the conductive path in the programmable impedance element is formed by application of a first voltage across the active and inert electrodes, the conductive path remaining once formed after the first voltage is removed.

16. The semiconductor memory device of claim 14, wherein at least a portion of the conductive path is dissolved to erase the programmable impedance element by application of a second voltage across the active and inert electrodes.

* * * * *